United States Patent
Afsahi et al.

(10) Patent No.: US 8,072,270 B2
(45) Date of Patent: Dec. 6, 2011

(54) CMOS RF POWER AMPLIFIER WITH LDMOS BIAS CIRCUIT FOR LARGE SUPPLY VOLTAGES

(75) Inventors: Ali Afsahi, San Diego, CA (US); Arya Reza Behzad, Poway, CA (US); Vijay Ramachandra Reddy, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 131 days.

(21) Appl. No.: 12/430,645

(22) Filed: Apr. 27, 2009

(65) Prior Publication Data

US 2010/0271135 A1   Oct. 28, 2010

(51) Int. Cl.
    *H03F 3/04* (2006.01)
(52) U.S. Cl. .......................... 330/296; 330/288; 330/269
(58) Field of Classification Search .................. 330/296, 330/288, 269
    See application file for complete search history.

(56) References Cited

U.S. PATENT DOCUMENTS

| | | | | |
|---|---|---|---|---|
| 5,696,459 | A * | 12/1997 | Neugebauer et al. | 327/108 |
| 6,816,012 | B2 * | 11/2004 | Aoki et al. | 330/276 |
| 6,970,022 | B1 * | 11/2005 | Miller | 327/77 |
| 7,102,434 | B2 * | 9/2006 | Grillo | 330/254 |
| 7,109,796 | B2 * | 9/2006 | Heigelmayer et al. | 330/254 |
| 7,135,928 | B2 * | 11/2006 | Behzad | 330/261 |
| 7,138,875 | B2 * | 11/2006 | Murari et al. | 330/311 |
| 7,397,085 | B2 * | 7/2008 | Marshall | 257/347 |
| 7,656,229 | B2 * | 2/2010 | Deng et al. | 330/149 |
| 7,821,339 | B1 * | 10/2010 | Afsahi | 330/253 |

* cited by examiner

*Primary Examiner* — Patricia Nguyen
(74) *Attorney, Agent, or Firm* — Garlick Harrison & Markison; Bruce E. Garlick

(57) ABSTRACT

Bias circuitry that may be used within a communications or other device includes a first current mirror having first and second transistors with sources coupled to ground and operable to receive a reference current at a drain of first transistor. A second current mirror has first and second transistors with drains coupled to a battery voltage supply. A third current mirror has first and second transistors with drains coupled to sources of the first and second transistors of the second current mirror, respectively. A biasing transistor couples between the second transistor of the first current mirror and the first transistor of the third current mirror and operable to receive a tuning input voltage at its gate. A resistive element coupled between the second transistor of the third current mirror and ground produces a bias voltage produced at a connection of the resistive element and the second transistor of the third current mirror.

16 Claims, 8 Drawing Sheets

CMOS RF POWER AMPLIFIER WITH LDMOS BIAS CIRCUIT FOR LARGE SUPPLY VOLTAGES

BACKGROUND

1. Technical Field

This invention relates generally to electronic circuitry and more particularly to bias voltage circuitry.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11x, Bluetooth, wireless wide area networks (e.g., WiMAX), advanced mobile phone services (AMPS), digital AMPS, global system for mobile communications (GSM), North American code division multiple access (CDMA), Wideband CDMA, local multi-point distribution systems (LMDS), multi-channel-multi-point distribution systems (MMDS), radio frequency identification (RFID), Enhanced Data rates for GSM Evolution (EDGE), General Packet Radio Service (GPRS), and many others.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations, and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard. As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In wireless communication devices, the RF power amplifier is often required to provide a high swing at its output. The RF power amplifier must also be very linear in its operation and also use as little power as possible. These competing goals are very difficult to meet. Conventional integrated circuitry is voltage limited due to device dimensions. Thus, the RF power amplifier is thus limited in its operational swing due to the voltage level at which it can operate. Further, when battery voltage exceeds the voltage limitation of the integrated circuit, a voltage regulator is required to generate a voltage that is usable by the integrated circuit. These shortcomings, among others are addressed by aspects of the present invention further described herein.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE DRAWINGS

Figure 1:
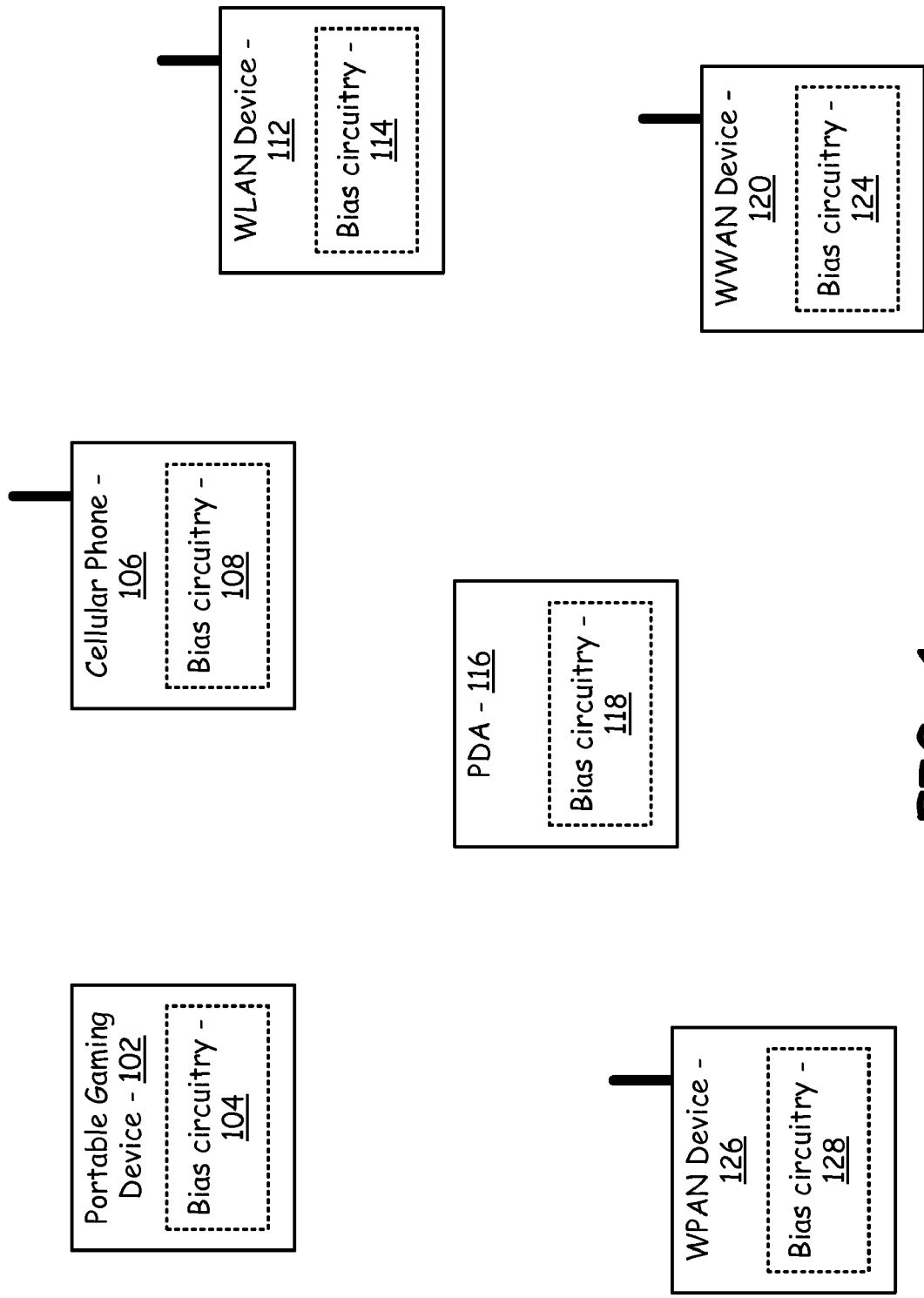
FIG. 1 is a system diagram illustrating a plurality of devices having bias circuitry constructed according one or more embodiments of the present invention.

FIG. 1 is a system diagram illustrating a plurality of devices having bias circuitry constructed according one or more embodiments of the present invention. Such devices include portable gaming device 102, cellular phone 106, wireless local area network (WLAN) device 112, wireless wide area network (WWAN) device 120, personal data assistant (PDA) 116, and wireless personal area network (WPAN) device 126. These devices 102, 106, 112, 120, 116, and 126 include bias circuitry 104, 108, 114, 124, 118, and 128, respectively. As will be further described herein with reference to FIGS. 2-8, the bias circuitry may be employed to provide one or more bias voltages to a radio frequency (RF) power amplifier of a wireless device. Such will be the case potentially for cellular phone 106, WWAN device 120, and WPAN device 126.

Of course the bias circuitry of the present invention can be used in any situation in which a bias voltage is produced within a device or within an integrated circuit contained within such device. According to one aspect of the present invention, the bias circuitry of the present invention may be coupled between a battery voltage node and ground. The bias circuitry of the present invention is constructed to withstand higher battery voltages used by some devices without voltage breakdown. Thus, according to some constructs of the present invention, laterally diffused metal oxide silicon (LDMOS) devices are used in the bias circuitry. LDMOS devices have relatively high voltage breakdown capabilities as compared to normal gate or normal transistors formed in an integrated circuit. The structure of LDMOS devices is generally known and is not described further herein other than with regard to the present invention.

Figure 2:
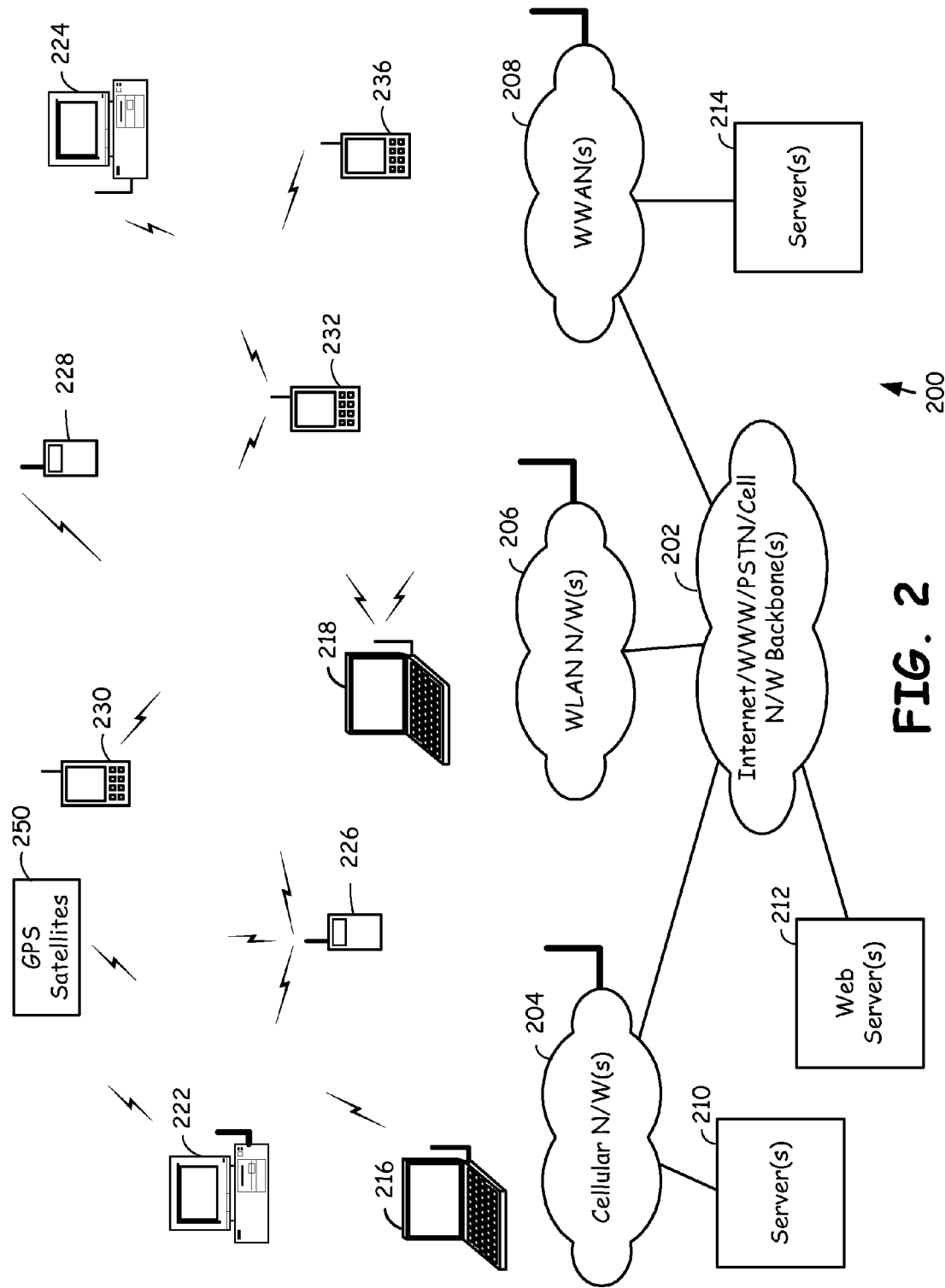
FIG. 2 is a system diagram illustrating a wireless communication system constructed and operating according to one or more embodiments of the present invention.

FIG. 2 is a system diagram illustrating a wireless communication system constructed and operating according to one or more embodiments of the present invention. The wireless communication system 200 of FIG. 2 includes a communication infrastructure and a plurality of wireless devices. The communication infrastructure includes one or more cellular networks 204, one or more wireless local area networks (WLANs) 206, and one or more wireless wide area networks (WWANs) 208. The cellular networks 204, WLANs 206, WWANs 208 all typically couple to one or more backbone networks. The backbone networks 202 may include the Internet, the Worldwide Web, one or more public switched telephone network backbones, one or more cellular network backbones, one or more private network backbones and/or other types of backbones that support communications with the various wireless network infrastructures 204, 206, and 208. Server computers may couple to these various network infrastructures. For example, server computer 210 couples to cellular network 204, web server 212 couples to the Internet/WWW/PSTN/Cell network 202, and server 214 couples to WWAN network 208. Other devices may couple to these networks as well in various other constructs.

Each of the cellular networks 204, WLANs 206, and WWANs 208 support wireless communications with wireless devices in various wireless spectra and according to various communication protocol standards. For example, the cellular network 204 may support wireless communications with wireless devices within the 800 MHz band and the 1800 MHz band, and/or other Radio Frequency (RF) bands that are allocated for cellular network communications. The cellular network 204 may support GSM, EDGE, GPRS, 3G, CDMA, TDMA, and/or various other standardized communications. Of course, these are examples only and should not be considered to limit the spectra or operations used by such cellular networks. The WLANs 206 typically operate within the Industrial, Scientific, and Medical (ISM) bands that include the 2.4 GHz and 5.8 GHz bands. The ISM bands include other frequencies as well that support other types of wireless communications, such bands including the 6.78 MHz, 13.56 MHz, 27.12 MHz, 40.68 MHz, 433.92 MHz, 915 MHz, 24.125 GHz, 61.25 GHz, 122.5 GHz, and 245 GHz bands. The WWANs networks 208 may operate within differing RF spectra based upon that which is allocated at any particular locale. Device to device communications may be serviced in one of these frequency bands as well.

The wireless network infrastructures 204, 206, and 208 support communications to and from wireless devices 216, 218, 222, 224, 226, 228, 230, 232, and/or 236. Various types of wireless devices are illustrated. These wireless devices include laptop computers 216 and 218, desktop computers 222 and 224, cellular telephones 226 and 228, portable beta terminals 230, 232, and 236. Of course, differing types of devices may be considered wireless devices within the context of the scope of the present invention. For example, automobiles themselves having cellular interfaces would be considered wireless devices according to the present invention. Further, any device having a wireless communications interface either bi-directional or uni-directional, may be considered a wireless device according to the present invention, in various other types of wireless devices. For example, wireless devices may include Global Positioning System (GPS) receiving capability to receive positioning signals from multiple GPS satellites 250.

The wireless devices 216-236 may support peer-to-peer communications as well, such peer-to-peer communications not requiring the support of a wireless network infrastructure. For example, these devices may communicate with each other in a 60 GHz spectrum, may use a peer-to-peer communications within a WLAN spectrum, for example, or may use other types of peer-to-peer communications. For example, within the ISM spectra, wireless devices may communicate according to Bluetooth protocol or any of the various available WLAN protocols supported by IEEE802.11x, for example.

As will be further described with reference to FIGS. 2-8, each of the wireless devices 216-236 illustrated in FIG. 2 includes baseband processing circuitry, Radio Frequency (RF) transceiver, and at least one antenna. According to the present invention, the RF transceiver includes an RF power amplifier having bias circuitry constructed and operating according to the present invention. The bias circuitry and/or the RF power amplifiers of these devices are efficient and able to operate at relatively high battery voltages without requiring a voltage regulator.

Figure 3:
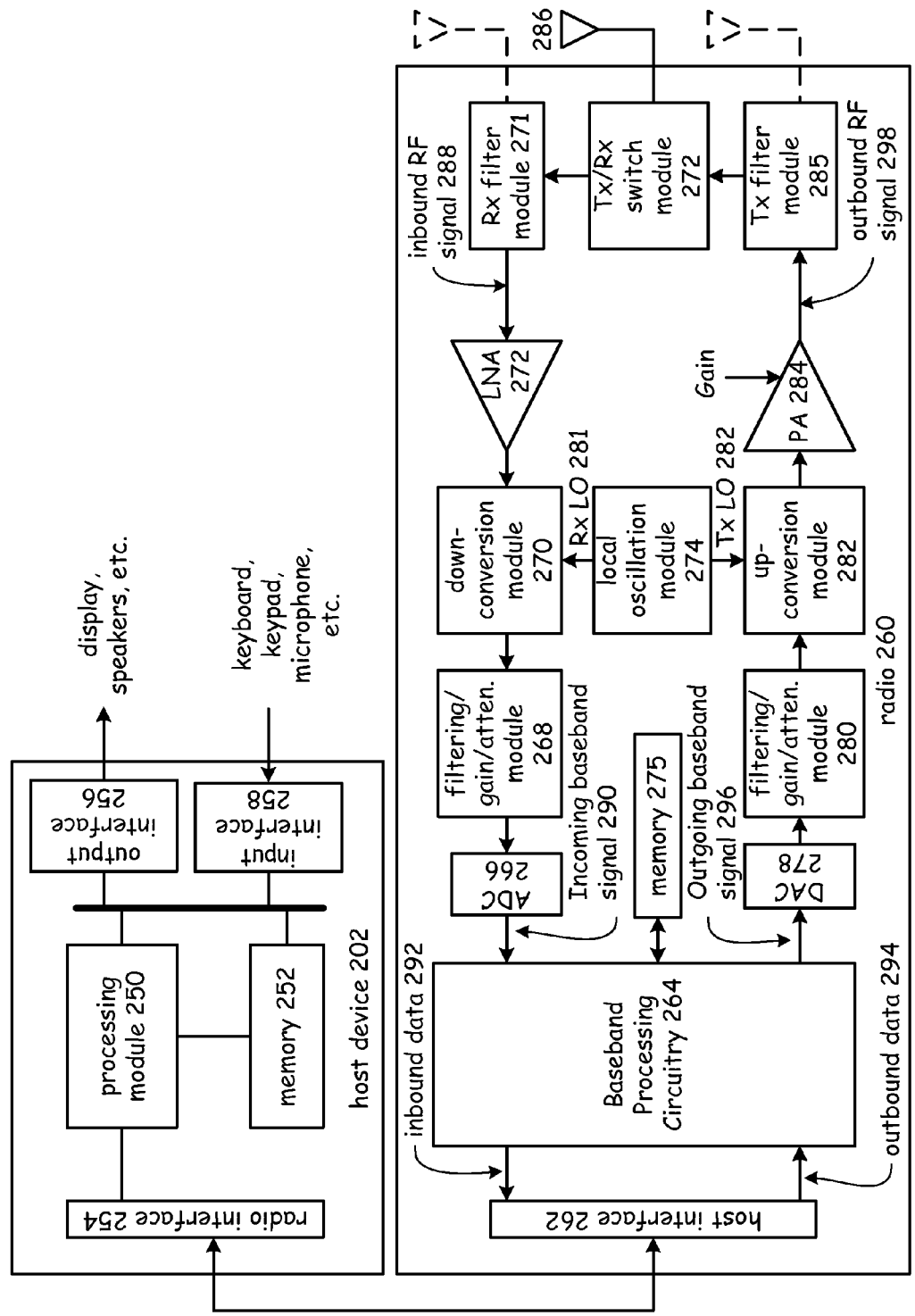
FIG. 3 is a schematic block diagram illustrating a wireless communication device that includes a host device and an associated radio.

FIG. 3 is a schematic block diagram illustrating a wireless communication device that includes a host device and an associated radio. For cellular telephone hosts, the radio 360 is a built-in component. For personal digital assistants hosts, laptop hosts, and/or personal computer hosts, the radio 360 may be built-in or may be an externally coupled component that couples to the host device 302 via a communication link, e.g., PCI interface, PCMCIA interface, USB interface, or another type of interface.

As illustrated, the host device 302 includes a processing module 350, memory 352, radio interface 354, input interface 358, and output interface 356. The processing module 350 and memory 352 execute the corresponding instructions that are typically done by the host device. For example, for a cellular telephone host device, the processing module 350 performs the corresponding communication functions in accordance with a particular cellular telephone standard.

The radio interface 354 allows data to be received from and sent to the radio 360. For data received from the radio 360 (e.g., inbound data), the radio interface 354 provides the data to the processing module 350 for further processing and/or routing to the output interface 356. The output interface 356 provides connectivity to an output display device such as a display, monitor, speakers, et cetera, such that the received data may be displayed. The radio interface 354 also provides data from the processing module 350 to the radio 360. The processing module 350 may receive the outbound data from an input device such as a keyboard, keypad, microphone, et cetera via the input interface 358 or generate the data itself. For data received via the input interface 358, the processing module 350 may perform a corresponding host function on the data and/or route it to the radio 360 via the radio interface 354.

Radio 360 includes a host interface 362, baseband processing circuitry/baseband processing module 364, an analog-to-digital converter (ADC) 366, a filtering/gain/attenuation module 368, an IF mixing down conversion stage 370, a receiver filter 371, a low noise amplifier (LNA) 372, a transmitter/receiver switch 373, a local oscillation module 374, memory 375, a digital-to-analog converter (DAC) 378, a filtering/gain/attenuation module 380, an IF mixing up conversion stage 382, a power amplifier (PA) 384, a transmitter filter module 385, and one or more antennas 386. The antenna 386 may be a single antenna that is shared by the transmit and receive paths as regulated by the Tx/Rx switch 373, or may include separate antennas for the transmit path and receive path. The antenna implementation will depend on the particular standard to which the wireless communication device is compliant and the particular design of the device.

The baseband processing circuitry 364, in combination with operational instructions stored in memory 375, executes digital receiver functions and digital transmitter functions. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The baseband processing circuitry 364 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 375 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing circuitry 364 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 375 stores, and the baseband processing circuitry 364 executes, operational instructions that facilitate functionality of the device.

In operation, the radio 360 receives outbound data 394 from the host device via the host interface 362. The host interface 362 routes the outbound data 394 to the baseband processing circuitry 364, which processes the outbound data 394 in accordance with a particular wireless communication standard (e.g., Cellular, WiMAX, IEEE802.11a, IEEE802.11b, IEEE802.11g, IEEE802.11n, Bluetooth, et cetera) to produce digital transmission formatted data/outgoing baseband signal 396. The digital transmission formatted data 396 will be a digital base-band signal or a digital low IF signal, where the low IF typically will be in the frequency range of one hundred kilohertz to a few megahertz.

The digital-to-analog converter 378 converts the digital transmission formatted data 396 from the digital domain to the analog domain. The filtering/gain/attenuation module 380 filters and/or adjusts the gain of the analog signal prior to providing it to the IF mixing stage 382. The IF mixing stage 382 directly or via multiple conversion steps (super heterodyne) converts the analog baseband or low IF signal into an RF signal based on a transmitter local oscillation 383 provided by local oscillation module 374. The power amplifier (PA) 384 amplifies the RF signal to produce outbound RF signal 398, which is filtered by the transmitter filter module 385. The antenna 386 transmits the outbound RF signal 398 to a targeted device such as a base station, an access point, and/or another wireless communication device.

The radio 360 also receives an inbound RF signal 388 via the antenna 386, which was transmitted by a base station, an access point, or another wireless communication device. The antenna 386 provides the inbound RF signal 388 to the receiver filter module 371 via the Tx/Rx switch 373, where the Rx filter 371 band pass filters the inbound RF signal 388. The Rx filter 371 provides the filtered RF signal to low noise amplifier (LNA) 372, which amplifies the signal 388 to produce an amplified inbound RF signal. The low noise amplifier 372 provides the amplified inbound RF signal to the IF mixing module 370, which directly converts the amplified inbound RF signal into an inbound low IF signal or baseband signal based on a receiver local oscillation 381 provided by local oscillation module 374. The down conversion module 370 provides the inbound low IF signal or baseband signal to the filtering/gain/attenuation module 368. The filtering/gain/attenuation module 368 may be implemented in accordance with the teachings of the present invention to filter and/or attenuate the inbound low IF signal or the inbound baseband signal to produce a filtered inbound signal.

The analog-to-digital converter 366 converts the filtered inbound signal from the analog domain to the digital domain to produce digital reception formatted data/incoming baseband signal 390. The baseband processing circuitry 364 decodes, descrambles, demaps, and/or demodulates the digital reception formatted data 390 to recapture inbound data 392 in accordance with the particular wireless communication standard being implemented by radio 360. The host interface 362 provides the recaptured inbound data 392 to the host device 28-32 via the radio interface 354.

As one of average skill in the art will appreciate, the wireless communication device of FIG. 3 may be implemented using one or more integrated circuits. For example, the host device may be implemented on one integrated circuit, the baseband processing circuitry 364, and memory 375 may be implemented on a second integrated circuit, and the remaining components of the radio 360, less the antenna(s) 386, may be implemented on a third integrated circuit. As an alternate example, the radio 360 may be implemented on a single integrated circuit. As yet another example, the processing module 350 of the host device and the baseband processing circuitry 364 may be a common processing device implemented on a single integrated circuit. Further, the memory 352 and memory 375 may be implemented on a single integrated circuit and/or on the same integrated circuit as the common processing modules of processing module 350 and the baseband processing circuitry 364.

The radio 360 and/or the host device components 302 may include bias circuitry constructed according to one or more aspects of the present invention. The bias circuitry of embodiments of the present invention is able to couple to a relatively high battery voltage source node, without the requirement of a voltage regulator. With such bias circuitry, an RF PA 384 may also be constructed to operate at the relatively high voltage battery source node, providing improved performance in amplifying RF signals for transmission. With the RF PA 384 operating at the relatively high voltage battery node, the bias circuitry may also operate at the relatively high voltage battery node and provide correct bias voltage(s) to the RF PA 384.

Figure 4:
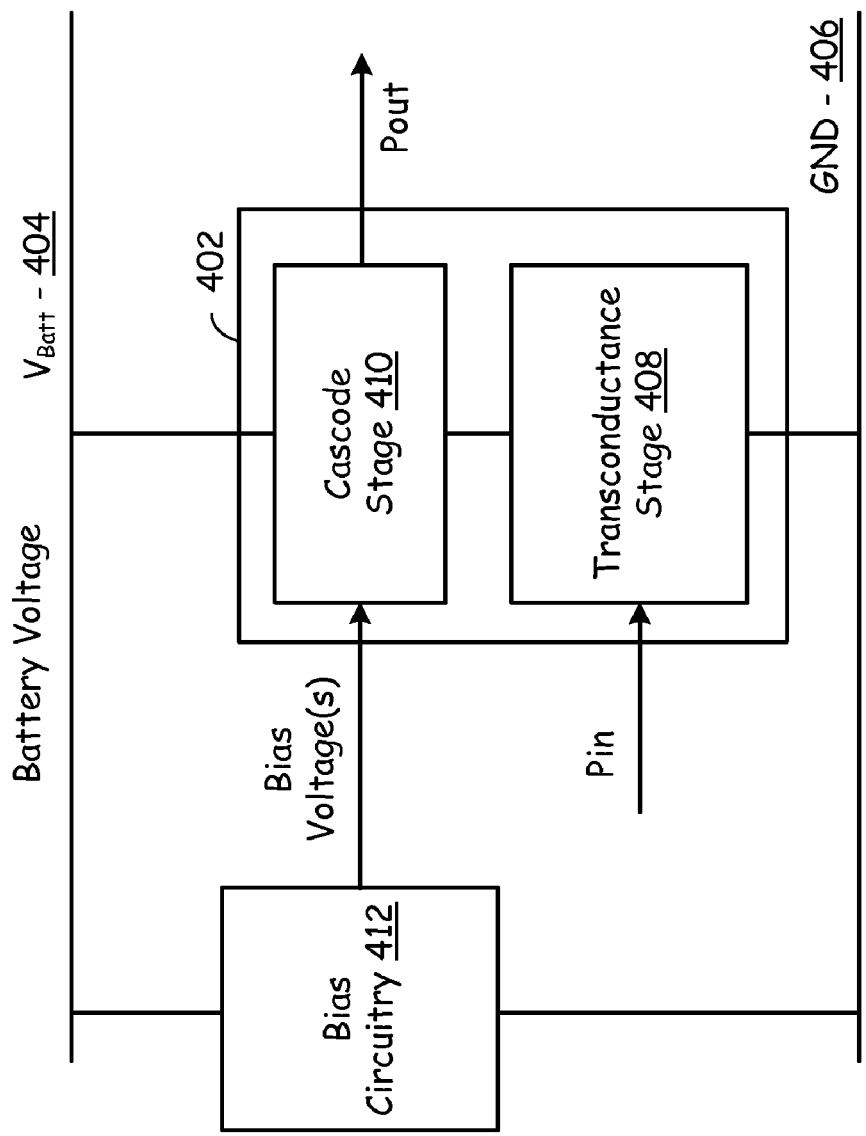
FIG. 4 is a block diagram illustrating a Radio Frequency (RF) cascode power amplifier constructed according to one or more embodiments of the present invention.

FIG. 4 is a block diagram illustrating a RF cascode power amplifier constructed according to one or more embodiments of the present invention. The RF power amplifier includes an amplifier portion 402 having a transconductance stage 408 and a cascode stage 410. The transconductance stage 408 has a transconductance device with an RF signal input operable to receive the RF input signal $P_{in}$. The cascode stage 410 has at least one cascode transistor and is coupled in series with the transconductance stage 408 between a battery voltage node 404 and ground 406. The cascode stage 410 has an RF signal output that produces the signal $P_{out}$. Further, the cascode stage 410 has at least one bias input that is applied to a gate of the at least one cascode transistor. As illustrated in FIG. 4, the at least one bias input receives one or more bias voltages, the number of which depends upon the number of cascode transistors included in the cascode stage 410.

The RF power amplifier of FIG. 4 further includes bias circuitry 412. The bias circuitry 412 couples between the battery voltage node 404 and ground 406. In its construct and operations, which will be described further herein with reference to FIGS. 5-8, the bias circuitry 412 applies a bias voltage or voltages to the at least one bias input of the cascode stage 410. The battery voltage upon which bias circuitry 412 determines and sets the bias voltage(s) is represented by $V_{Batt}$ present at the battery voltage node 404. As will be further illustrated with reference to FIGS. 5-8, the bias voltage(s) is/are based upon the voltage at the battery voltage node 404, which also serves as the signal output node to produce signal $P_{out}$.

Figure 5:
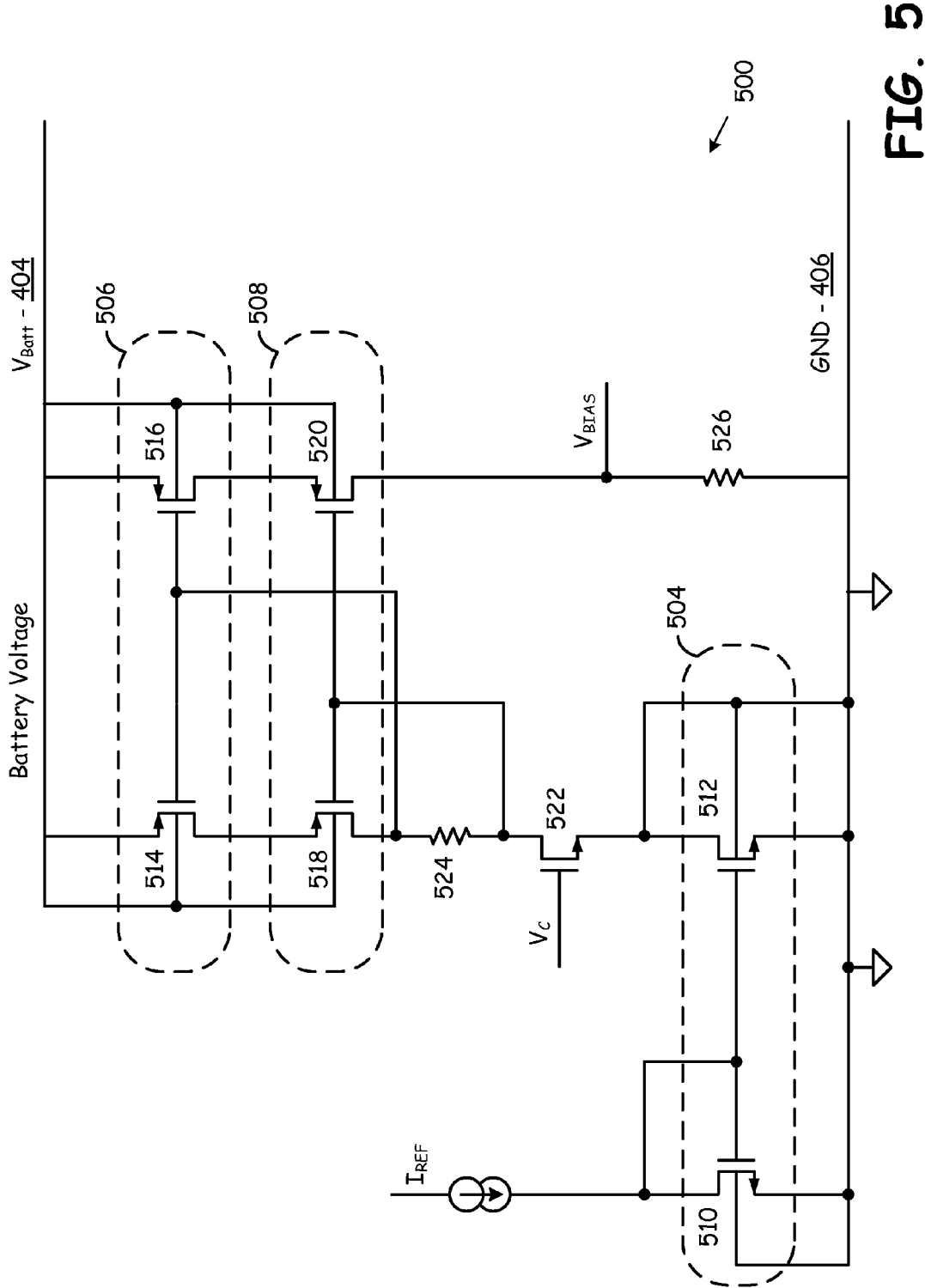
FIG. 5 is a circuit diagram illustrating bias circuitry constructed according to one or more embodiments of the present invention.

FIG. 5 is a circuit diagram illustrating bias circuitry constructed according to one or more embodiments of the present invention. The bias circuitry 500 may be employed with any of the various devices illustrated in FIGS. 1, 2, and 3 and that will be described subsequently with reference to FIGS. 6A-7. The bias circuitry 500 couples between a battery voltage node 404 and ground 406. According to the structure of FIG. 5, the bias circuitry 500 is able to tolerate relatively high battery voltages, e.g., 5.5 volts or higher using conventional silicon CMOS technology with components having small dimensions. Thus, with the bias circuitry of FIG. 5, a separate voltage supply is not required to generate bias voltages for one or more other components of the device in which the structure of FIG. 5 is located.

The bias circuitry includes a first current mirror having 504 first transistor 510 and second transistor 512 with their sources coupled to ground 402 and operable to receive a reference current $I_{REF}$ at a drain of the first transistor 510. The bias circuitry 504 of FIG. 5 further includes a second current mirror 506 having first transistor 514 and second transistor 516 with drains coupled to a battery supply voltage 404. The bias circuitry 500 of FIG. 5 includes a third current mirror 508 having first transistor 518 and second transistor 520 with their drains coupled to the sources of the first transistor 514 and second transistor 516 of the second current mirror 506, respectively. The transistors 518 and 520 of the third current mirror 508 may be laterally diffused P-type metal oxide silicon (LDPMOS) devices.

The bias circuitry 500 further includes biasing transistor 522 that has its source and drain coupled between the second transistor 512 of the first current mirror 504 and the first transistor 518 of the third current mirror 508. The biasing transistor 522 is operable to receive a tuning input voltage $V_C$ at its gate. The biasing transistor 522 may be a laterally diffused N-type metal oxide silicon (LDNMOS) device. The bias circuitry 500 of FIG. 5 may also include resistor 524 that is coupled between the biasing transistor 522 and the first transistor 518 of the third current mirror 508. Tuning voltage $V_C$ is set to compensate for process variations of the bias circuitry 500 and operational variations such as changes in temperature and/or battery voltage at battery voltage node $V_{Batt}$ 404. Finally, the bias circuitry 500 of FIG. 5 includes a resistive element 526 that is coupled between the second transistor 520 of the third current mirror 508 and ground 402. At a top portion of the resistive element 526, a bias voltage $V_{BIAS}$ is produced.

With the bias circuitry 500 of FIG. 5, the reference current $I_{REF}$ passes through first transistor 510 of the first current mirror 502 within a first leg of the bias circuitry. The current through transistor 510 is mirrored to the second transistor 512, which is substantially the current $I_{REF}$. Residing in a second leg of the bias circuitry of FIG. 5 are the first transistor 514 of the second current mirror 506, the first transistor 518 of the second current mirror 508, the biasing transistor 522, the second transistor 512 of the first current mirror 504, and with the embodiment of FIG. 5, the resistive element 524. Selection of resistor 524 is intended to limit the voltage drop from drain to source across the various transistors of the second leg of the bias circuitry and to set voltages at various points in the second leg. A third leg of the bias circuitry 500 of FIG. 5 includes second transistor 516 of the second current mirror 506, the second transistor 520 of the third current mirror 508, and the resistive element 526. With the structure of FIG. 5, the current $I_{REF}$ is substantially mirrored in both the second and third legs of the bias circuitry. Thus, the bias voltage $V_{BIAS}$ voltage is a product of $I_{REF}$ and the resistance of resistive element 526. The resistive element 526 may be a bulk resistor or it may be a transistor coupled into a resistor configuration.

According to one aspect of the present invention, the first transistor 518 and the second transistor 520 of the third current mirror are LDPMOS devices. With these devices forming the third current mirror 508, a significant voltage drop exists across these LDPMOS devices. Thus, the transistors 514 and 516 of the second mirror 506 and the second transistor 512 of the first current mirror 504 may be standard transistors without risk of voltage breakdown of the transistors 514, 516, and 512. With the biasing transistor 522 being an LDNMOS device, the biasing transistor 522 reduces the drain to source voltage across transistors 514 and 512 and allows them to be thin gate transistors. However, in other embodiments, one or more of transistors 514 and 512 may be thick gate devices.

The $V_{BIAS}$ voltage produced at a top portion of resistive element 526 may be applied directly as a bias voltage. Alternatively, as will be further described with reference to FIG. 6B, the bias circuitry or device in which the bias circuitry exists may further include bias voltage divider circuitry. The bias voltage divider circuitry will receive the $V_{BIAS}$ signal from the structure of FIG. 5 and will further process the bias voltage to produce a plurality of differing bias voltages for application to differing devices.

Figure 6A:
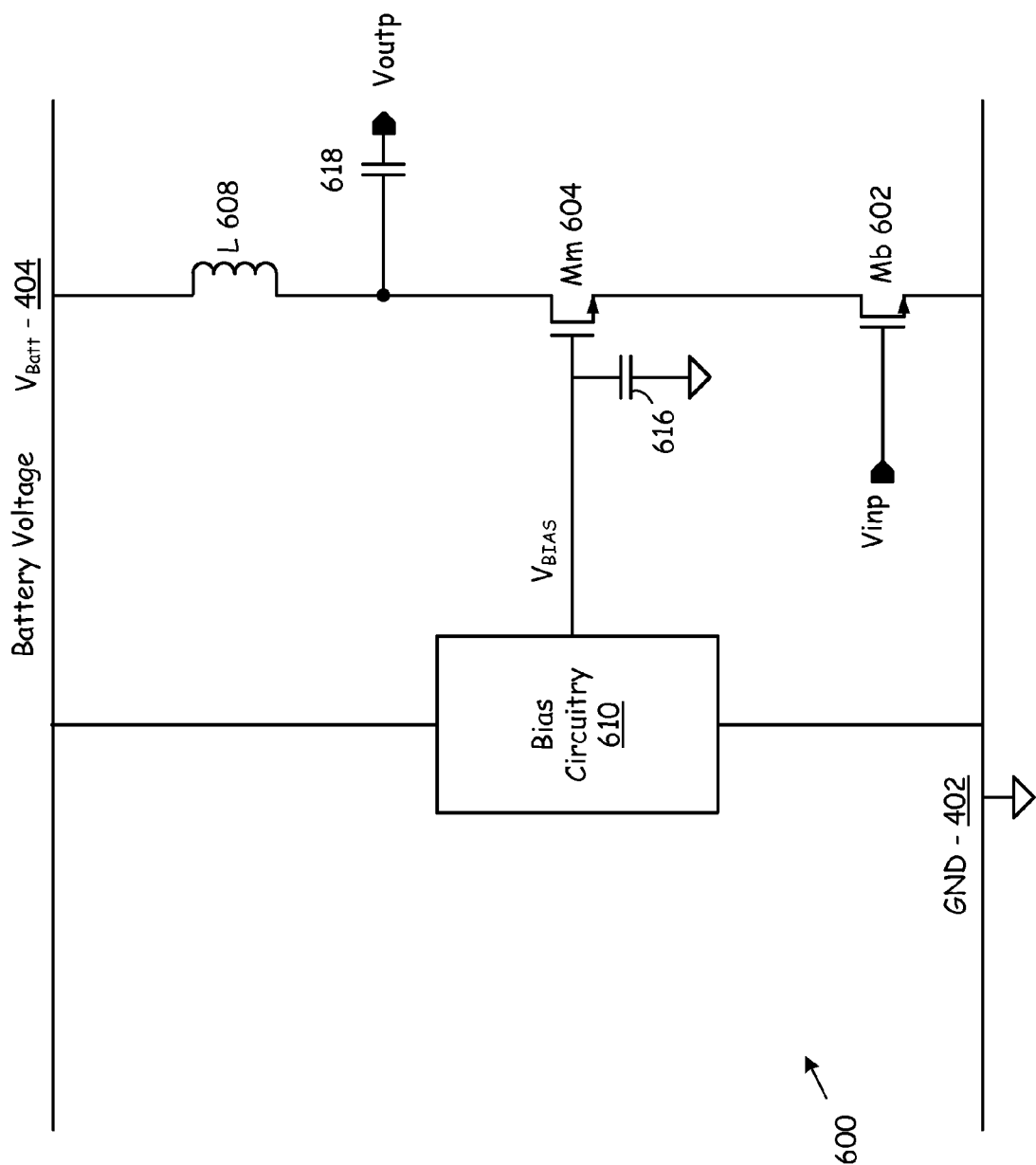
FIG. 6A is a block diagram illustrating a RF cascode power amplifier constructed according to one or more embodiments of the present invention.

FIG. 6A is a block diagram illustrating a RF cascode power amplifier constructed according to one or more embodiments of the present invention. The RF power amplifier 650 includes a transconductance stage having a transconductance transistor 602 that receives an RF signal into its gate. The RF power amplifier further includes a cascode stage having a cascode transistor 604. The cascode stage couples in series with the transconductance stage between a battery voltage node 404 and ground 402. The cascode stage produces an RF signal output $V_{outp}$ and receives a bias voltage input $V_{BIAS}$ at the gate of transistor 604. The RF power amplifier further includes a load/choke inductor L 608 and coupling capacitor 618. However, in other embodiments, other configurations may be used for AC coupling/AC blocking.

Bias circuitry 610 of FIG. 6A may be, in some embodiments, the circuitry described previously with reference to FIG. 5. In such case, the bias circuitry 610 couples between battery voltage $V_{Batt}$ 404 and ground 402. The bias circuitry 610 produces an output $V_{BIAS}$, which is applied to the gate of cascode transistor 604. Capacitor 616 filters high frequency components of the bias signal $V_{BIAS}$ such that the cascode transistor 604 is biased substantially with a DC voltage. The bias circuitry 610 may alternately apply a disabling voltage to cascode transistors 604. In such case, by disabling the operation of cascode transistor 604, reduced current drain between battery voltage node $V_{BATT}$ 404 and ground 402 is accomplished for power savings operations.

Figure 6B:
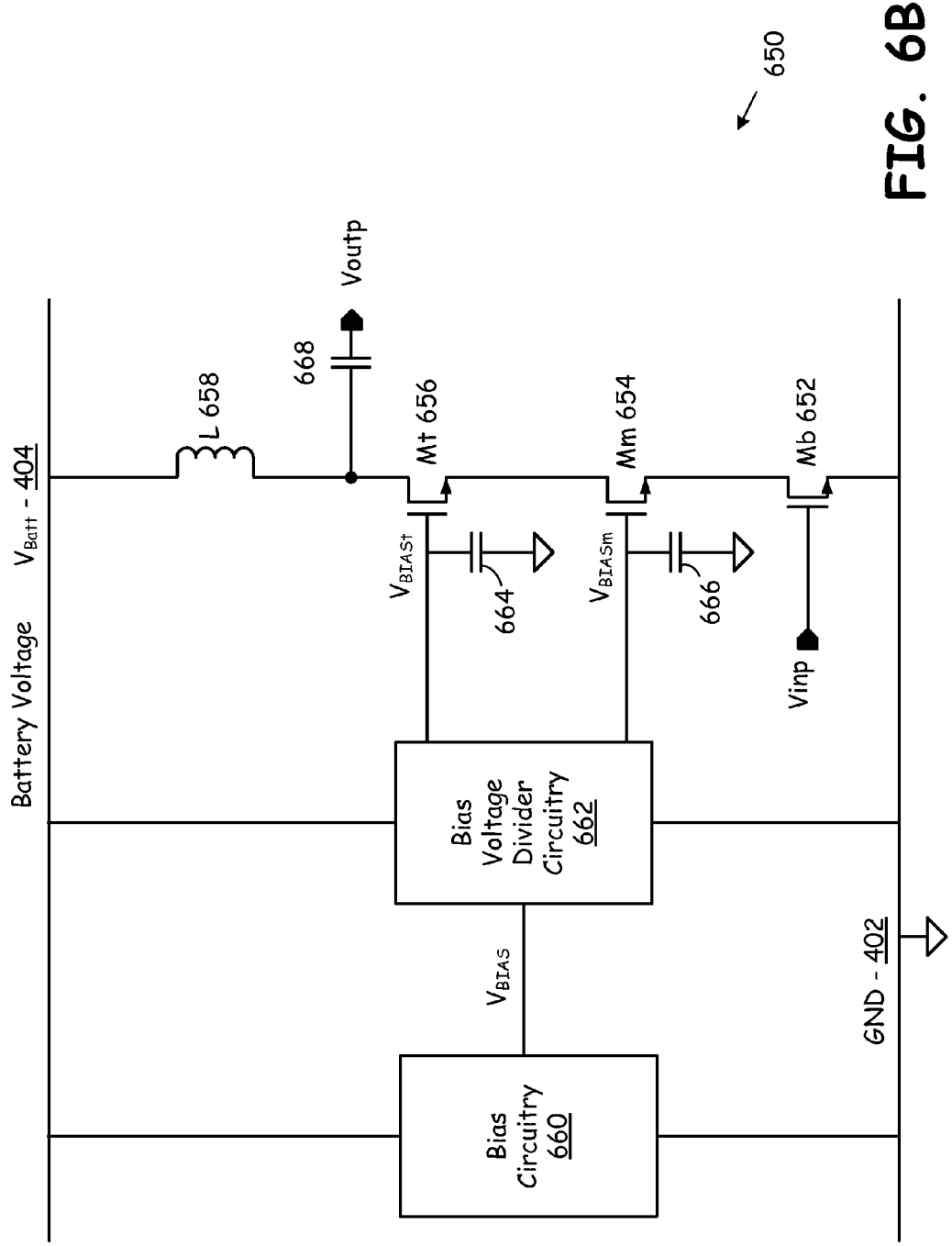
FIG. 6B is a block diagram illustrating another RF cascode power amplifier constructed according to one or more embodiments of the present invention.

FIG. 6B is a block diagram illustrating a RF cascode power amplifier constructed according to one or more embodiments of the present invention. The RF power amplifier 650 includes a transconductance stage having a transconductance transistor 652 that receives an RF signal into its gate. The RF power amplifier further includes a cascode stage having cascode transistors 654 and 656. The cascode stage couples in series with the transconductance stage between a battery voltage node 404 and ground 402. The cascode stage produces an RF signal output $V_{outp}$ and receives a plurality of bias voltage inputs. The bias voltage inputs are represented as signals $V_{BIAS+}$ and $V_{BIASm}$ and received at the gates of transistors 656 and 654, respectively. The RF power amplifier further includes a load/choke inductor L 658 and coupling capacitor 668. However, in other embodiments, other configurations may be used for AC coupling/AC blocking.

Bias circuitry 660 of FIG. 6B may be, in some embodiments, the circuitry described previously with reference to FIG. 5. In such case, the bias circuitry 660 couples between battery voltage $V_{Batt}$ 404 and ground 402. The bias circuitry 660 produces an output $V_{BIAS}$. Bias voltage divider circuitry 662 receives the $V_{BIAS}$ signal and produces $V_{BIAS+}$ and $V_{BIASm}$ to cascode transistors 656 and 654, respectively. Capacitors 664 and 666 filter high frequency components of the bias signals $V_{BIAS+}$ and $V_{BIASm}$ such that the cascode transistors 656 and 654 are biased substantially with DC voltages. The bias voltage divider circuitry 662 may have the further functionality of applying disabling voltages to cascode transistors 656 and 654. In such case, by disabling the operation of cascode transistors 656 and 654, the current drain between battery voltage node $V_{BATT}$ 404 and ground 402 is accomplished for power savings operations.

Figure 7:
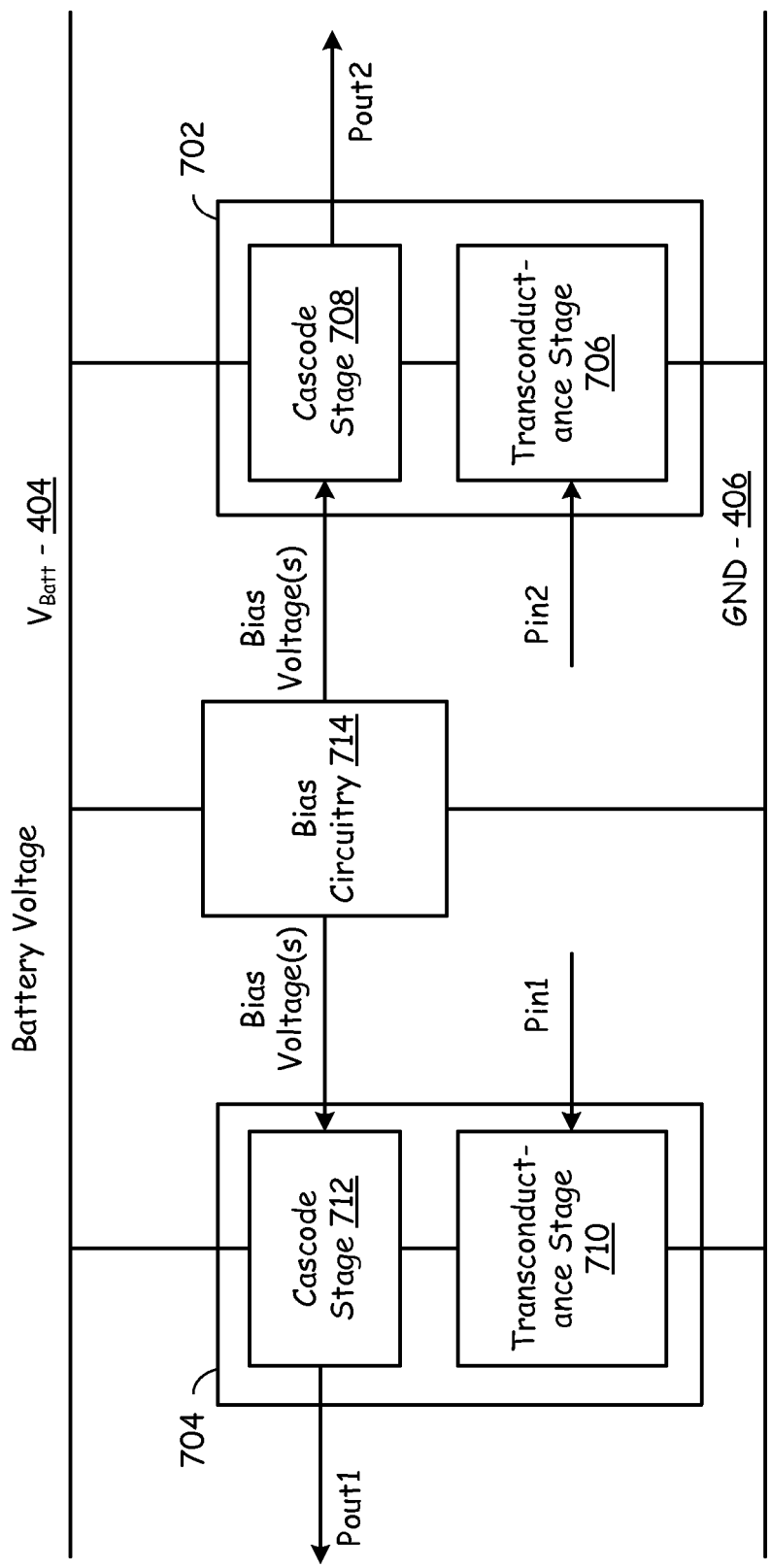
FIG. 7 is a block diagram illustrating a differential embodiment of an RF cascode power amplifier constructed according to one or more embodiments of the present invention.

FIG. 7 is a block diagram illustrating a differential embodiment of an RF cascode power amplifier constructed according to one or more embodiments of the present invention. The differential RF power amplifier includes single-ended cascode amplifiers 702 and 704. Cascode amplifier 702 includes transconductance stage 706 and cascode stage 708. Cascode amplifier 704 includes transconductance stage 710 and cascode stage 712. Bias circuitry 714 applies bias voltages to one or more bias voltage inputs of the cascode stages 708 and 712. Differential signal inputs are input to transconductance stages 710 and 706. Differential transconductance stage outputs are present at output connections. The structure of FIG. 6A or 6B may be employed for each of the single-ended cascode amplifiers 702 and 704.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

The invention claimed is:

1. A Radio Frequency (RF) power amplifier comprising:
   a transconductance stage having a transistor with an RF signal input at its gate;
   a cascode stage having at least one cascode transistor, the cascode stage coupled in series with the transconductance stage between a battery voltage node and ground, the cascode stage having an RF signal output and at least one bias input to the at least one cascode transistor; and
   bias circuitry comprising:
   a first current minor having first and second transistors with sources coupled to ground and operable to receive a reference current at a drain of the first transistor;
   a second current minor having first and second transistors with sources coupled to a battery supply voltage;
   a third current mirror having first and second transistors with sources coupled to drains of the first and second transistors of the second current minor, respectively;
   a biasing transistor coupled between the second transistor of the first current minor and the first transistor of the third current minor and operable to receive a tuning input voltage at its gate; and
   a resistive element coupled between the second transistor of the third current mirror and ground, a bias voltage produced at a connection of the resistive element and the second transistor of the third current mirror.

2. The RF power amplifier of claim 1, wherein:
   the first transistor of the first current mirror resides in a first leg of the bias circuitry;
   the second transistor of the first current mirror, the first transistor of the second current minor, the first transistor of the third current mirror, and the biasing transistor reside in a second leg of the bias circuitry; and
   the second transistor of the second current mirror, the second transistor of the second current mirror, and the resistive element reside in a third leg of the bias circuitry.

3. The RF power amplifier of claim 2, wherein the bias circuitry is operable such that currents in each of the first, second, and third legs of the bias circuitry are substantially equal.

4. The RF power amplifier of claim 3, wherein the bias voltage is a product of the current in the third leg and a resistance of the resistive element.

5. The RF power amplifier of claim 1, wherein the first and second transistors of the third current minor comprise laterally diffused P-type metal oxide silicon (LDPMOS) devices.

6. The RF power amplifier of claim 1, wherein the biasing transistor comprises a laterally diffused N-type metal oxide silicon (LDNMOS) device.

7. The RF power amplifier of claim 1, further comprising voltage bias voltage divider circuitry operable to:
   receive the bias voltage from the bias circuitry; and
   produce a plurality of bias voltage outputs based upon the bias voltage.

8. The RF power amplifier of claim 7, wherein the voltage bias divider circuitry comprises:
   a plurality of lumped circuit elements; and
   a plurality of controllable switches that inter couple the plurality of lumped circuit elements.

9. Bias circuitry of an integrated circuit comprising:
   a first current minor having first and second transistors with sources coupled to ground and operable to receive a reference current at a drain of the first transistor;
   a second current minor having first and second transistors with sources coupled to a battery voltage supply;
   a third current mirror having first and second transistors with sources coupled to drains of the first and second transistors of the second current minor, respectively;
   a biasing transistor coupled between the second transistor of the first current minor and the first transistor of the third current minor and operable to receive a tuning input voltage at its gate; and
   a resistive element coupled between the second transistor of the third current mirror and ground, a bias voltage produced at a connection of the resistive element and the second transistor of the third current mirror.

10. The bias circuitry of claim 9, wherein:
    the first transistor of the first current mirror resides in a first leg of the bias circuitry;
    the first transistor of the second current mirror, the first transistor of the second current minor, and the biasing transistor reside in a second leg of the bias circuitry; and
    the second transistor of the second current mirror, the second transistor of the second current mirror, and the resistive element reside in a third leg of the bias circuitry.

11. The bias circuitry of claim 10, wherein the bias circuitry is operable such that currents in each of the first, second, and third legs of the bias circuitry are substantially equal.

12. The bias circuitry of claim 11, wherein the bias voltage is a product of the current in the third leg and a resistance of the resistive element.

13. The bias circuitry of claim 9, wherein the first and second transistors of the third current minor comprise laterally diffused metal oxide semiconductor P-type metal oxide silicon (LDPMOS) devices.

14. The bias circuitry of claim 9, wherein the biasing transistor comprises a laterally diffused metal oxide semiconductor N-type metal oxide silicon (LDPMOS) device.

15. The bias circuitry of claim 9, further comprising voltage bias voltage divider circuitry operable to:

receive the bias voltage from the bias circuitry; and
produce a plurality of bias voltage outputs based upon the bias voltage.

16. The bias circuitry of claim 15, wherein the voltage bias divider circuitry comprises:

a plurality of lumped circuit elements; and
a plurality of controllable switches that inter couple the plurality of lumped circuit elements.

* * * * *

UNITED STATES PATENT AND TRADEMARK OFFICE
CERTIFICATE OF CORRECTION

PATENT NO.         : 8,072,270 B2                                        Page 1 of 1
APPLICATION NO.    : 12/430645
DATED              : December 6, 2011
INVENTOR(S)        : Ali Afsahi et al.

It is certified that error appears in the above-identified patent and that said Letters Patent is hereby corrected as shown below:

Col. 11, line 45, in claim 1: replace "minor" with --mirror--
Col. 11, line 48, in claim 1: replace "minor" with --mirror--
Col. 11, line 52, in claim 1: replace "minor" with --mirror--
Col. 11, line 54, in claim 1: replace "minor" with --mirror--
Col. 11, line 55, in claim 1: replace "minor" with --mirror--
Col. 11, line 67, in claim 2: replace "minor" with --mirror--
Col. 12, lines 3-4, in claim 2: replace "the second transistor of the second current mirror, the second transistor of the second current mirror" with --the second transistor of the first current mirror, the second transistor of the second current mirror--
Col. 12, line 16, in claim 5: replace "minor" with --mirror--
Col. 12, line 34, in claim 9: replace "minor" with --mirror--
Col. 12, line 37, in claim 9: replace "minor" with --mirror--
Col. 12, line 44, in claim 9: replace "minor" with --mirror--
Col. 12, line 45, in claim 9: replace "minor" with --mirror--
Col. 12, line 56, in claim 10: replace "minor" with --mirror--
Col 12, lines 58-59, in claim 10: replace "the second transistor of the second current mirror, the second transistor of the second current mirror" with --the second transistor of the first current mirror, the second transistor of the second current mirror--
Col. 13, line 2, in claim 13: replace "minor" with --mirror--

Signed and Sealed this
Fifteenth Day of January, 2013

David J. Kappos
*Director of the United States Patent and Trademark Office*